United States Patent
Wang

(10) Patent No.: US 9,705,508 B2
(45) Date of Patent: Jul. 11, 2017

(54) CIRCUIT SYSTEM ADAPTIVELY ADJUSTING SUPPLY VOLTAGE ACCORDING TO TEMPERATURE AND OPERATING METHOD THEREOF

(71) Applicant: MStar Semiconductor, Inc., Hsinchu Hsien (TW)

(72) Inventor: Yao-Chi Wang, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 14/714,690

(22) Filed: May 18, 2015

(65) Prior Publication Data

US 2015/0341039 A1    Nov. 26, 2015

(30) Foreign Application Priority Data

May 20, 2014  (TW) ............... 103117627 A

(51) Int. Cl.
*H03L 7/02*    (2006.01)

(52) U.S. Cl.
CPC ........ *H03L 7/02* (2013.01); *H03B 2200/0038* (2013.01)

(58) Field of Classification Search
CPC .................................. H03L 1/02; H03L 1/022
USPC ................ 331/117, 167, 182, 183, 185, 186
See application file for complete search history.

(56) References Cited

U.S. PATENT DOCUMENTS

| | | | | |
|---|---|---|---|---|
| 2005/0231297 | A1* | 10/2005 | Aparin | H03L 7/099 331/177 V |
| 2008/0150641 | A1* | 6/2008 | Costa | H03L 7/099 331/16 |
| 2010/0244968 | A1* | 9/2010 | Tsukizawa | H03L 1/022 331/17 |
| 2013/0314167 | A1* | 11/2013 | Sinoussi | H03B 5/08 331/167 |
| 2015/0180486 | A1* | 6/2015 | Shanan | H03L 7/085 327/156 |

FOREIGN PATENT DOCUMENTS

TW        201340586         10/2013

OTHER PUBLICATIONS

Taiwan Patent Office, "Office Action," Jul. 29, 2015.

* cited by examiner

*Primary Examiner* — Jeffrey Shin
(74) *Attorney, Agent, or Firm* — WPAT, PC

(57) ABSTRACT

A circuit system includes a current supply module, a voltage supply module and a voltage-controlled oscillator (VCO). The current supply module provides a current adapted to an ambient temperature. The voltage supply module receives the current and generates an adapted voltage according to the current. The VCO receives the adapted voltage and generates an oscillation signal according to the adapted voltage.

9 Claims, 6 Drawing Sheets

CIRCUIT SYSTEM ADAPTIVELY ADJUSTING SUPPLY VOLTAGE ACCORDING TO TEMPERATURE AND OPERATING METHOD THEREOF

This application claims the benefit of Taiwan application Ser. No. 103117627, filed May 20, 2014, the subject matter of which is incorporated herein by reference.

BACKGROUND OF THE INVENTION

Field of the Invention

The invention relates in general to a circuit system, and more particularly to a technology that adaptively provides a supply voltage in a circuit system.

Description of the Related Art

A voltage-controlled oscillator (VCO) is an essential element commonly applied in various kinds of electronic systems. In general, the temperature of an electronic product rises after a period using the electronic product. The rise in the ambient temperature results a drop in the amplitude of output signals of the VCO, leading to degradation in the phase noise performance. On the other hand, oscillation start-up of a VCO can be more difficult in higher temperatures. For the above issues, in a current solution, the amount of a source current provided to the VCO is adaptively changed according to the ambient temperature. More specifically, the amount of a source current provided to the VCO is increased as the ambient temperature rises, so as to compensate the amplitude of output signals of the VCO.

FIG. 1 shows a schematic diagram of a known technology. An operating power of the VCO 120 is provided by a current source 140. Generally known to one skilled in the technical field, the current source 140 is a proportional to absolute temperature (PTAT) current source, which outputs an output current $I_{PTAT}$ having a size that is proportional to the absolute temperature. A drawback of the approach in FIG. 1 is that, to minimize the phase noise, a p-type metal-oxide semiconductor field-effect transistor (MOSFET) forming a current mirror in the current source 140 is designed to have a large size, which occupies a considerable chip area.

FIG. 2 shows a schematic diagram of another known technology. An operating power of a VCO 220 is provided by a programmable current source 242, and a control circuit 244 determines the amount of current to be outputted by the programmable current source 242 according to ambient temperature information detected by a thermal sensor 246. In practice, the control circuit 244 is usually built-in with a look-up table storing the corresponding relationship between the temperature and the amount of current. One drawback of the approach in FIG. 2 is that the thermal sensor 246 needs to be additionally provided. Another drawback of the approach in FIG. 2 is that, when an internal switch of the programmable current source 242 is switched to adjust the amount of current in response to a looked-up result, a discontinuous change in the source current may lead to jittering in the output frequency of the VCO 220. For a frequency division duplexing (FDD) system that highly demands a stable connection or a television tuner that requires a stable display image, frequency jittering is a severe issue.

FIG. 3 shows a schematic diagram of yet another known technology. An operating power of a VCO 320 is provided by a programmable current source 342, and a control circuit 344 determines the amount of current to be outputted by the programmable current source 342 according to ambient temperature information detected by an amplitude detector 346. With such approach, one drawback is that the amplitude detector 346 needs to be additionally provided, and another drawback is that frequency jittering may also be caused.

As a common feature of the three known technologies above, the amount of a source current is adaptively provided to a VCO according to an ambient temperature. However, the three known technologies also suffer from certain drawbacks.

SUMMARY OF THE INVENTION

According to an embodiment of the present invention, a circuit system is provided. The circuit system includes a current supply module, a voltage supply module, and a voltage-controlled oscillator (VCO). The current supply module provides a current adapted to an ambient temperature. The voltage supply module receives the current, and generates an adapted voltage according to the current. The VCO receives the adapted voltage, and generates an oscillation signal according to the adapted voltage. The voltage-controlled oscillator in response to the adapted voltage compensates an amplitude variation of the oscillation signal resulting from a variation of the ambient temperature.

According to another embodiment of the present invention, an operating method for a circuit system is provided. The operating method includes: a) providing a current adapted to an ambient temperature; b) generating an adapted voltage according to the current; and c) generating an oscillation signal according to the adapted voltage. The voltage-controlled oscillator in response to the adapted voltage compensates an amplitude variation of the oscillation signal resulting from a variation of the ambient temperature.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
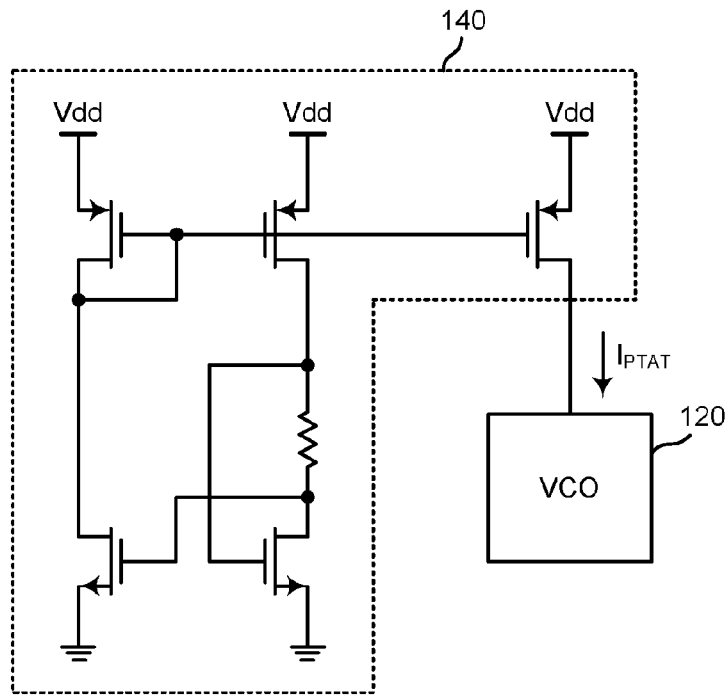
FIG. 1 to FIG. 3 are schematic diagrams of known temperature compensation technologies.
Figure 2:
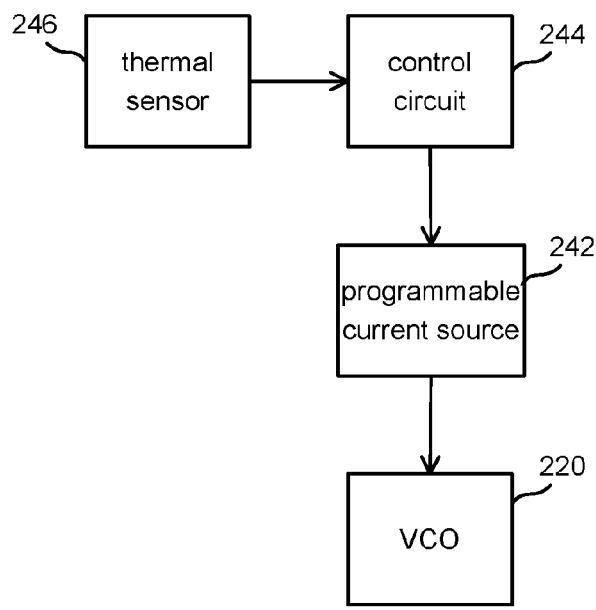
Figure 3:
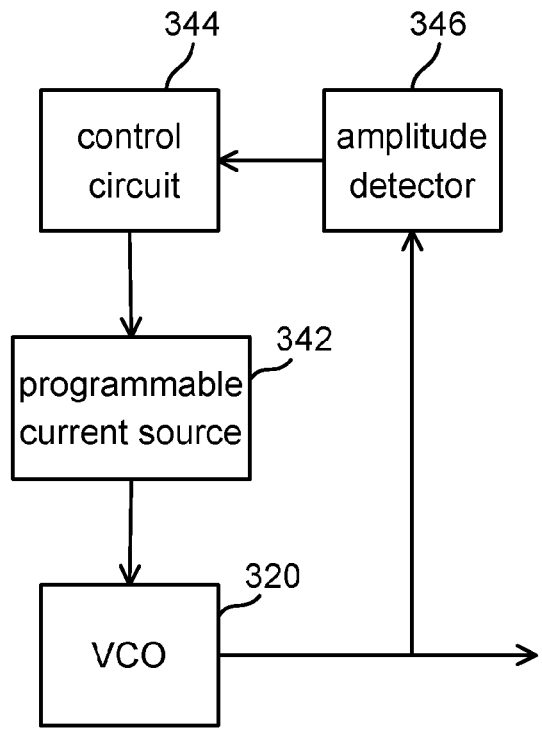

It should be noted that, the term "present invention" refers to inventive concepts described by the non-limiting embodiments. Drawings of the present invention include functional block diagrams of multiple functionally associated modules. These drawings are not detailed circuit diagrams, and connection lines therein represent signal flows only. Multiple interactive relationships between the functional elements and/or procedures can be achieved through direct or indirect electrical connections. Further, functions of individual elements need not be assigned as depicted in the drawings, and discrete blocks need not be implemented by discrete electronic elements.

Figure 4:
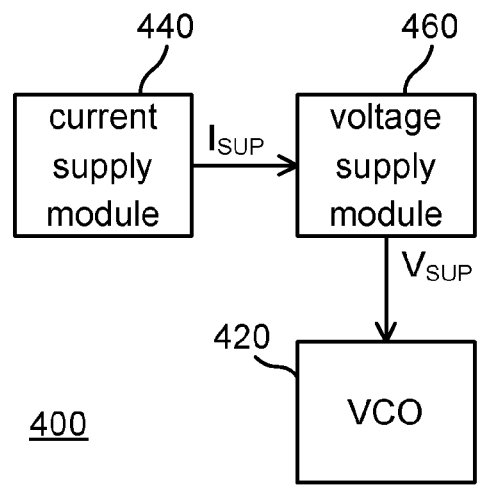
FIG. 4 is a block diagram of a circuit system according to an embodiment of the present invention.

FIG. 4 shows a block diagram of a circuit system according to an embodiment of the present invention. Referring to FIG. 4, a circuit system 400 includes a current supply module 440, a voltage supply module 460 and a voltage-controlled oscillator (VCO) 420. The current supply module 440 provides a current $I_{SUP}$ that changes with an ambient temperature. Therefore, the current is adapted to the ambient temperature. The voltage supply module 460, coupled to the current supply module 440, receives the current $I_{SUP}$ and generates an adapted voltage $V_{SUP}$ according to the current $I_{SUP}$. The VCO 420, coupled to the voltage supply module 460, receives the adapted voltage $V_{SUP}$ and generates an oscillation signal according to the adapted voltage $V_{SUP}$. In the embodiment, the current $I_{SUP}$ generated by the current supply module 440 increases as the temperature rises, and the adapted voltage $V_{SUP}$ generated by the voltage supply module 460 also correspondingly increases as the current $I_{SUP}$ increases. Operation details of the functional blocks are given below.

In the current supply module 440, a corresponding relationship between the current $I_{SUP}$ and the ambient temperature is designed in a way that the adapted voltage $V_{SUP}$ substantially keeps an amplitude of an output signal of the VCO 420 unaffected from the ambient temperature. In practice, a circuit designer may determine the corresponding relationship between the current $I_{SUP}$ and the ambient temperature for the current supply module 440 according to amplitude characteristics of the VCO 420. In other words, the corresponding relationship between the current $I_{SUP}$ and the ambient temperature is not limited by the present invention. In one embodiment, the current supply module 440 includes a proportional to absolute temperature (PTAT) current generator for generating a PTAT current as the current $I_{SUP}$ provided to the voltage supply module 460.

Figure 5A:
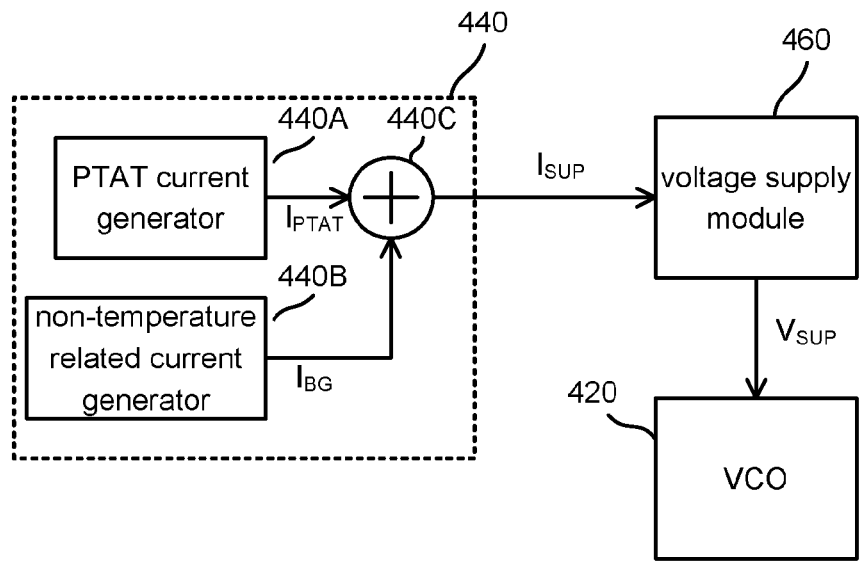
FIG. 5(A) and FIG. 5(B) are detail diagrams of examples of a current supply module according to an embodiment of the present invention.

In another embodiment, as shown in FIG. 5(A), the current supply module 440 includes a PTAT current generator 440A, a non-temperature related current generator 440B, and an adder 440C. The PTAT current generator 440A generates a PTAT current $I_{PTAT}$. The non-temperature related current generator 440B generates a non-temperature related current $I_{BG}$. The PTAT current $I_{PTAT}$ and the non-temperature related current $I_{BG}$ are added by the adder 440C to form the current $I_{SUP}$ provided to the voltage supply module 460. The non-temperature related current $I_{BG}$ generated by the non-temperature related current generator 440B does not change with the temperature. That is to say, the non-temperature related current $I_{BG}$ stays at a constant value for any temperature, and has an effect of adding a constant current amount to the current $I_{SUP}$. In practice, whether to add the non-temperature related current $I_{BG}$ to the PTAT current $I_{PTAT}$ is determined according to characteristics of the amplitude of the VCO 420 in response to the temperature. In practice, the non-temperature related current generator 440B may be implemented by a bandgap current generator.

Figure 5B:
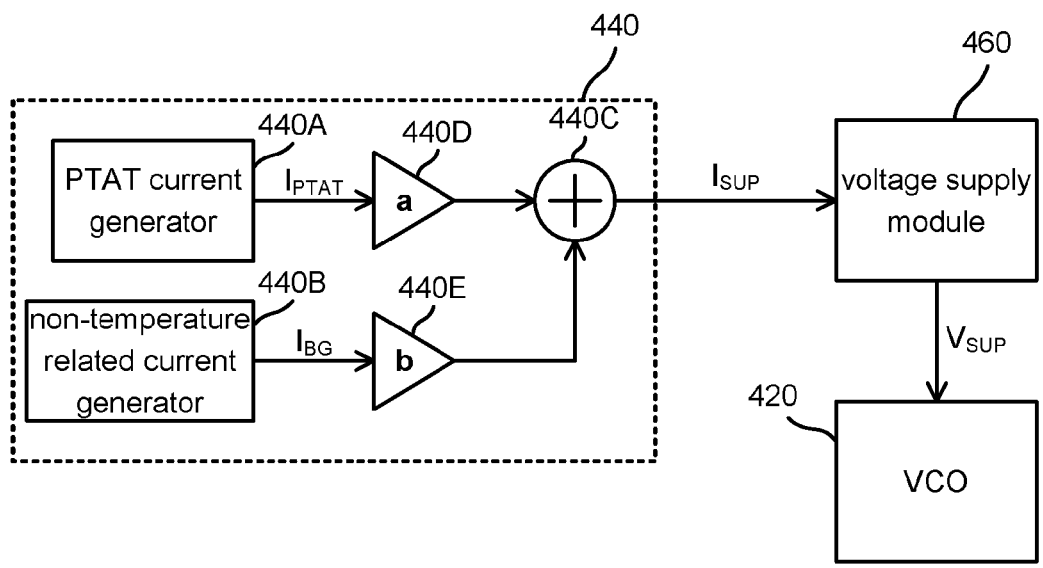

As shown in FIG. 5(B), the current supply module 440 may further include a first multiplier 440D and a second multiplier 440E. The first multiplier 440D multiplies the PTAT current $I_{PTAT}$ by a first ratio a to generate a first current component in the current $I_{SUP}$. The second multiplier 440E multiplies the non-temperature related current $I_{BG}$ by a second ratio b to generate a second current component in the current $I_{SUP}$. In practice, the first ratio a and the second ratio b are determined by characteristics of the amplitude of the VCO 420 in response to the temperature. For example, before the circuit system is shipped out of the factory, the characteristics of the amplitude of the VCO 420 in response to the temperature may be obtained through measurement and/or simulation to accordingly appropriately determine the first ratio a and the second ratio b. Further, the first multiplier 440D and the second multiplier 440E may be implemented by current mirrors.

Figure 6A:
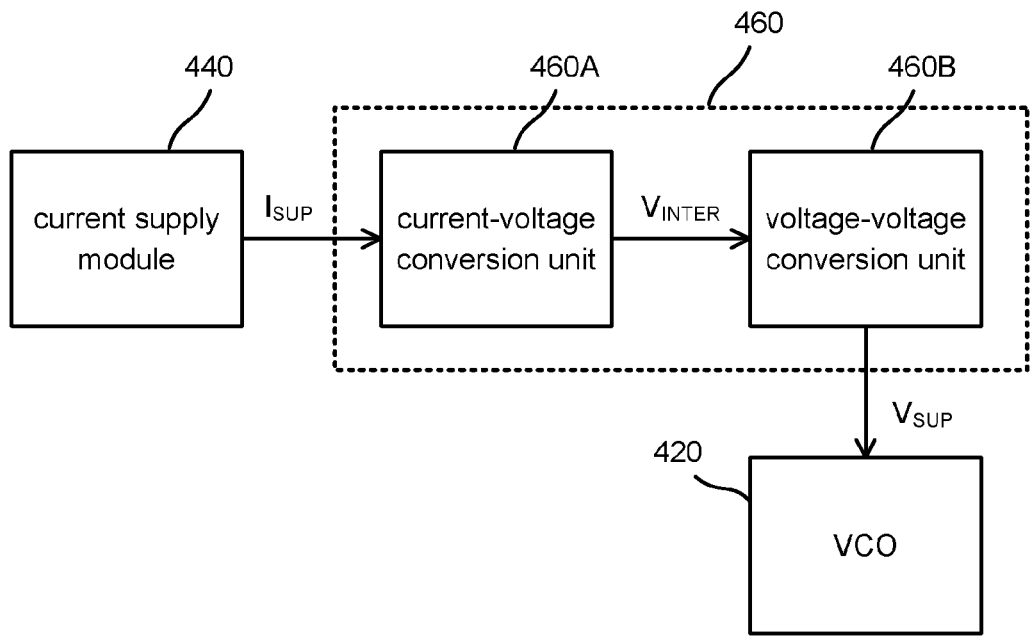
FIG. 6(A) and FIG. 6(B) are detail diagrams of examples of a voltage supply module according to an embodiment of the present invention.
Figure 6B:
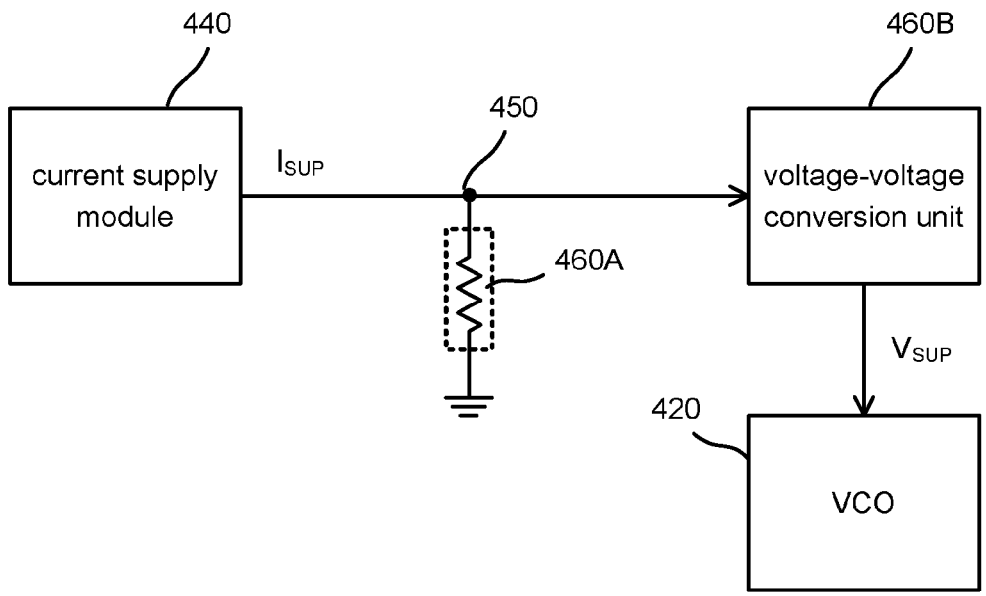
Figure 7A:
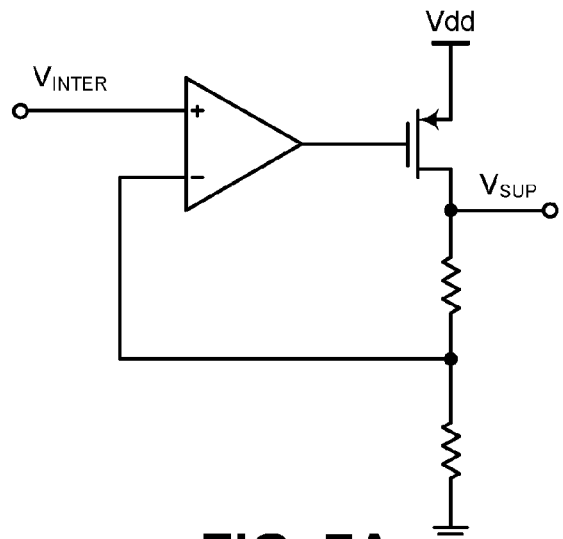
FIG. 7(A) to FIG. 7(D) are detail diagrams of examples of a voltage-voltage conversion unit according to an embodiment of the present invention.
Figure 7B:
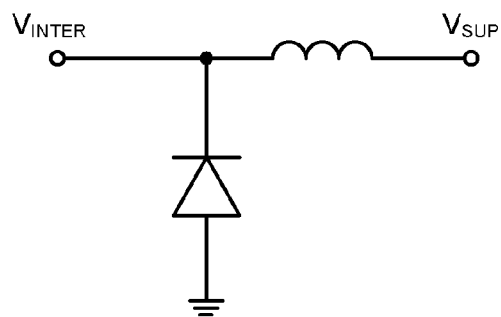
Figure 7C:
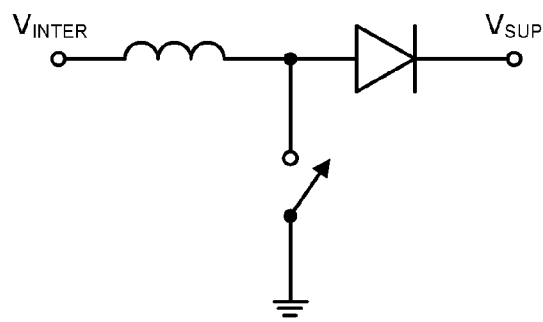
Figure 7D:
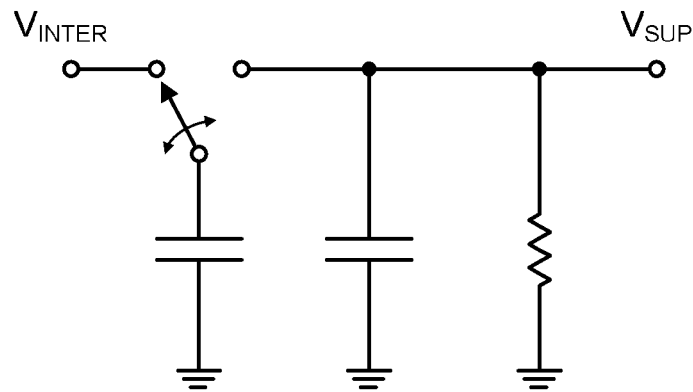

As shown in FIG. 6(A), the voltage supply module 460 may include a current-voltage conversion unit 460A and a voltage-voltage conversion unit 460B. The current-voltage conversion unit 460A converts the current $I_{SUP}$ to an intermediate voltage $V_{INTER}$. The voltage-voltage conversion unit 460B converts the intermediate voltage $V_{INTER}$ to the adapted voltage $V_{SUP}$. For example, the current-voltage conversion unit 460A may be a resistor element, as shown in FIG. 6(B). The voltage formed after the current $I_{SUP}$ flows into the resistor is the intermediate voltage $V_{INTER}$. In practice, the voltage-voltage conversion unit 460B is a low-dropout (LDO) regulator, a step-down DC-DC converter, a step-up DC-DC converter, or a charge pump. The four possible DC voltage-voltage conversion implementation forms are respectively depicted in FIG. 7(A) to FIG. 7(D). It should be noted that, details of the current-voltage conversion and voltage-voltage conversion are generally known to one skilled in the technical field, and shall be omitted herein.

It should be noted that, a VCO in many circuit systems is originally provided with a voltage-voltage conversion circuit such as an LDO regulator, whose output voltage does not change with the temperature. In the present invention, by incorporating the current $I_{SUP}$ provided by the current supply module 440 and the current-voltage conversion unit 460A with the voltage-voltage conversion circuit such as an LDO regulator originally present in the circuit system, the supply source $V_{SUP}$ outputted from the voltage-voltage conversion circuit is caused to change with the temperature to further compensate the amplitude of the oscillation signal of the VCO 420. That means the voltage-controlled oscillator in response to the adapted voltage compensates an amplitude variation of the oscillation signal resulting from a variation of the ambient temperature. Therefore, the approach based on the present invention does not require numerous additional large-area circuit elements. Further, for a design that adopts a PTAT current generator (e.g., 440A) or a combination of a PTAT current generator and a bandgap current generator, discontinuous amplitude jittering is not caused when the current $I_{SUP}$ and the adapted voltage $V_{SUP}$ change with the temperature, thereby eliminating the issue of frequency jittering of the known technology.

Figure 8:
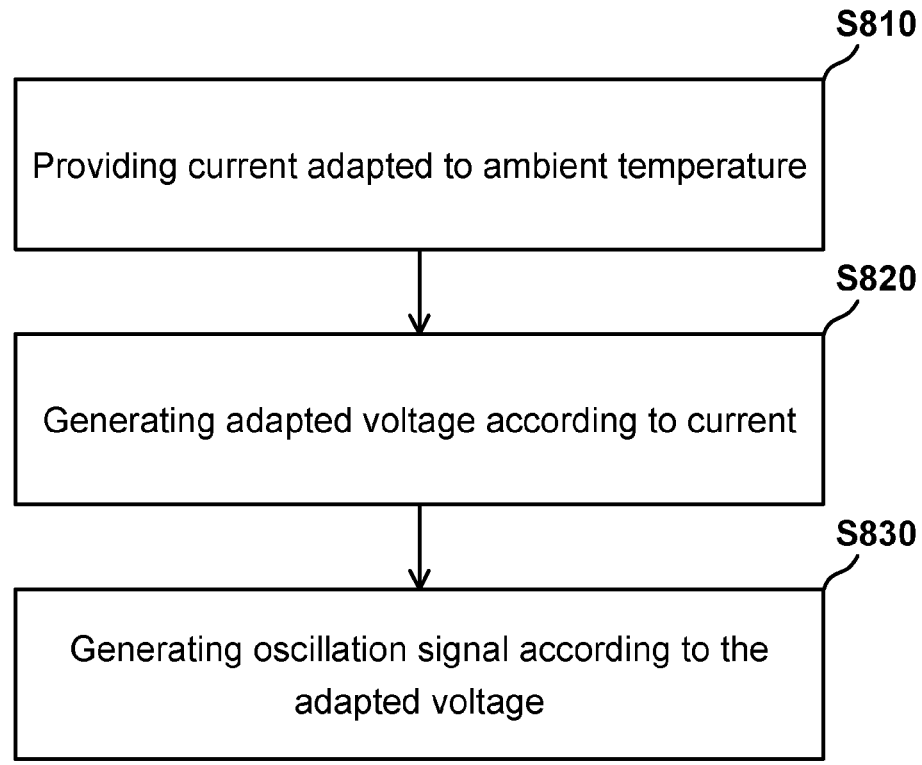
FIG. 8 is a flowchart of an operating method for a circuit system according to an embodiment of the present invention.

FIG. 8 shows a flowchart of an operating method for a circuit system according to another embodiment of the present invention. In step S810, a current that changes with an ambient temperature is provided. In step S820, an adapted voltage is generated according to the current. In step S830, an oscillation signal is generated according to the adapted voltage. One person skilled in the technical field can appreciate that, various operations and details disclosed in the description associated with the circuit system 400 are applicable to the operating method for a circuit system in FIG. 8, and shall be omitted herein.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A circuit system, comprising:
a current supply module, for providing an adapted current according to an ambient temperature, comprises:
a proportional to absolute temperature (PTAT) current generator, for generating a PTAT current;
a non-temperature related current generator, for generating a non-temperature related current;
a first multiplier, for multiplying the PTAT current by a first ratio to generate a first current component in the adapted current; and
a second multiplier, for multiplying the non-temperature related current by a second ratio to generate a second current component in the adapted current;
a voltage supply module, for receiving the adapted current and generating an adapted voltage based on the adapted current; and
a voltage-controlled oscillator (VCO), for receiving the adapted voltage directly from the voltage supply module and generating an oscillation signal with ambient temperature compensation according to the adapted voltage;
wherein, the adapted voltage is generated without using a temperature sensor and without using an amplitude sensor for sensing an amplitude of the oscillation signal;
wherein, the current supply module adds said PTAT current to said non-temperature related current to generate said adapted current, wherein the adapted current provided by the current supply module is associated with the PTAT current, and is also associated with the non-temperature related current; and
wherein, the first ratio and the second ratio are determined by characteristics of the amplitude variation of the oscillation signal in response to the variation of the ambient temperature.

2. The circuit system according to claim 1, wherein the non-temperature related current generator is a bandgap current generator.

3. The circuit system according to claim 1, wherein the first multiplier and the second multiplier are implemented by current mirrors.

4. The circuit system according to claim 1, wherein the voltage supply module comprises:
a current-voltage conversion unit, for converting the adapted current to an intermediate voltage; and
a voltage-voltage conversion unit, for converting the intermediate voltage to the adapted voltage.

5. The circuit system according to claim 4, wherein the current-voltage conversion unit is a resistor element.

6. The circuit system according to claim 4, wherein the voltage-voltage conversion unit is one of a low-dropout (LDO) regulator, a step-down DC-DC converter, a step-up DC-DC converter, and a charge pump.

7. An operating method for a circuit system, comprising:
a) generating a proportional to absolute temperature (PTAT) current;
b) generating a non-temperature related current;
c) generating an adapted current according to an ambient temperature by adding the PTAT current and the non-temperature related current;
d) generating an adapted voltage according to the adapted current; and
e) controlling a voltage-controlled oscillator according to the adapted voltage to generate an oscillation signal with ambient temperature compensation;
wherein the adapted voltage is generated without using a temperature sensor and without using an amplitude sensor for sensing an amplitude of the oscillation signal;
wherein, the adapted voltage is directly applied to the voltage-controlled oscillator; and
wherein the step of c) further comprises:
multiplying the PTAT current by a first ratio to generate a first current component in the adapted current; and
multiplying the non-temperature related current by a second ratio to generate a second current component in the adapted current;
wherein, the first ratio and the second ratio are determined by characteristics of the amplitude variation of the oscillation signal in response to the variation of the ambient temperature.

8. The operating system according to claim 7, wherein step (d) comprises:
converting the adapted current to an intermediate voltage; and
converting the intermediate voltage to the adapted voltage.

9. A circuit system, comprising:
a current supply module, configured to provide for providing an adapted current adapted according to an ambient temperature, comprises:
a proportional to absolute temperature (PTAT) current generator, for generating a PTAT current; and
a non-temperature related current generator, for generating a non-temperature related current;
a voltage supply module, configured to receive for receiving the adapted current and to generate generating an adapted voltage according to based on the adapted current, the voltage supply module comprising:
a current-voltage conversion unit, for converting the adapted current to an intermediate voltage; and
a voltage-voltage conversion unit, for converting the intermediate voltage to the adapted voltage, wherein the voltage-voltage conversion unit is one of a low-dropout (LDO) regulator, a step-down DC-DC converter, a step-up DC-DC converter, and a charge pump;
a voltage-controlled oscillator (VCO), configured to receive for receiving the adapted voltage directly from the voltage supply module and to generate generating an oscillation signal with ambient temperature compensation according to the adapted voltage;
wherein, the voltage-controlled oscillator in response to the adapted voltage compensates an amplitude variation of the oscillation signal resulting from a variation of the ambient temperature;
wherein, the adapted voltage is generated without using a temperature sensor and without using an amplitude sensor for sensing an amplitude of the oscillation signal; and
wherein, the current supply module adds said PTAT current to said non-temperature related current to generate said adapted current.

* * * * *